United States Patent
Frenkel et al.

(10) Patent No.: US 6,365,516 B1
(45) Date of Patent: Apr. 2, 2002

(54) ADVANCED COBALT SILICIDATION WITH IN-SITU HYDROGEN PLASMA CLEAN

(75) Inventors: Austin Frenkel, Dresden (DE); Akif Sultan; Paul Besser, both of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/483,081

(22) Filed: Jan. 14, 2000

(51) Int. Cl.[7] .................... H01L 21/44; H01L 21/302
(52) U.S. Cl. .................... 438/682; 438/683; 438/656; 438/664; 438/711
(58) Field of Search .................... 438/682, 396, 438/624, 635, 768, 683, 592, 586, 660, 656, 680, 685, 694, 710, 711, 664, 655; 156/345

(56) References Cited

U.S. PATENT DOCUMENTS

| | | | |
|---|---|---|---|
| 4,994,402 A | 2/1991 | Chiu | 437/41 |
| 5,030,590 A | 7/1991 | Amini et al. | 438/704 |
| 5,147,499 A | 9/1992 | Szwejkowski et al. | 438/704 |
| 5,223,445 A | 6/1993 | Fuse | 437/24 |
| 5,296,093 A | 3/1994 | Szwejkowski et al. | 216/13 |
| 5,425,843 A | * 6/1995 | Saul et al. | 438/694 |
| 5,431,770 A | 7/1995 | Lee et al. | 438/704 |
| 5,567,651 A | 10/1996 | Berti et al. | 437/200 |
| 5,614,428 A | 3/1997 | Kapoor | 438/592 |
| 5,741,721 A | * 4/1998 | Stevens | 438/396 |
| 5,780,361 A | * 7/1998 | Inoue | 438/683 |
| 5,780,362 A | 7/1998 | Wang et al. | 438/683 |
| 5,834,371 A | * 11/1998 | Ameen et al. | 438/656 |
| 5,851,891 A | 12/1998 | Dawson et al. | 438/305 |
| 5,874,342 A | 2/1999 | Tsai et al. | 438/301 |
| 5,902,129 A | 5/1999 | Yoshikawa et al. | 438/592 |
| 5,937,325 A | 8/1999 | Ishida | 438/655 |
| 5,953,633 A | * 9/1999 | Chen et al. | 438/683 |
| 5,970,370 A | 10/1999 | Besser et al. | 438/586 |
| 5,970,379 A | 10/1999 | Chen et al. | 438/682 |
| 5,976,767 A | 11/1999 | Li Li | 438/753 |
| 5,976,769 A | 11/1999 | Chapman | 438/734 |
| 5,989,988 A | * 11/1999 | Iinuma et al. | 438/592 |
| 6,028,015 A | * 2/2000 | Wang et al. | 438/787 |
| 6,143,128 A | * 11/2000 | Ameen et al. | 165/345 |

FOREIGN PATENT DOCUMENTS

JP 409162167 A * 6/1997 ........... H01L/21/28

OTHER PUBLICATIONS

Stanley Wolf and Richard N. Tauber: *Silicon Processing for the VLSI Era; vol. 1: Process Technology*; pp. 92–95, 97 and 106–107; 1986.

Stanley Wolf and Richard N. Tauber; *Silicon Processing for the VLSI Era, vol. 1—Process Technology*; pp. 516–517 and 529–530; 1986.

* cited by examiner

*Primary Examiner*—Matthew Smith
*Assistant Examiner*—Igwe U. Anya
(74) *Attorney, Agent, or Firm*—Timothy M. Honeycutt

(57) ABSTRACT

Various methods of fabricating a silicide structure are provided. In one aspect, a method of fabricating a circuit structure on a silicon surface is provided that includes exposing the silicon surface to a plasma ambient containing hydrogen and an inert gas, and depositing a metallic material capable of forming silicide on the silicon surface. The metallic material is heated to form a metal silicide on the silicon surface. The method provides for low sheet resistance silicide structures by eliminating native oxide films without the risk of spacer material backsputtering.

16 Claims, 2 Drawing Sheets

ADVANCED COBALT SILICIDATION WITH IN-SITU HYDROGEN PLASMA CLEAN

BACKGROUND OF THE INVENTION

1. Field of the Invention

This invention relates generally to semiconductor processing, and more particularly, to a method of fabricating a cobalt silicide film on a substrate.

2. Description of the Related Art

A typical field effect transistor implemented in silicon consists of a source and a drain formed in a silicon substrate, and separated laterally to define a channel region in the substrate. A gate electrode composed of a conducting material, such as aluminum or polysilicon, is disposed over the channel region and designed to generate an electric field in the channel region. Changes in the electric field generated by the gate electrode enable, or alternatively, disable the flow of current between the source and the drain.

In a conventional process flow for forming a typical field effect transistor, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The substrate is annealed to activate the dopant in the source and the drain. Dielectric sidewall spacers are frequently formed adjacent to the gate electrode to serve as implant masks and barriers to hot carriers.

The interfaces between structures of a transistor implemented in silicon or polysilicon, such as source/drain regions and poly gates, and local or global interconnects typically exhibit relatively high series sheet resistances. The resistances can lead to undesirably high power consumption and heat propagation in integrated circuits. One method in use for years to reduce the series resistance of these types of structural interfaces involves the fabrication of metal-silicide layers on sources and drains, and on gate electrodes where polysilicon is the material of choice. Self-aligned silicidation ("salicidation") is perhaps the most common application of this method.

In conventional salicidation, a metal capable of reacting with silicon, such as titanium, is deposited on the gate, the sidewall spacers, and the source and drain regions. A one or two step anneal is performed to react the titanium with the polysilicon of the gate and the silicon of the source and drain regions to form $TiSi_2$. Following the anneal, an etch is performed to remove any unreacted titanium.

In addition to serving as implant masks, one of the principal functions of sidewall spacers is to separate the silicided gate from the source/drain regions. Despite the incorporation of spacers, silicide may form laterally and easily bridge the separation between the polysilicon gate electrode and the silicon source/drain regions causing the gate to become shorted to the source/drain regions. This so-called "bridging effect" occurs where silicon diffuses into the titanium regions that cover the sidewall spacers and subsequently reacts with the titanium.

Certain conditions tend to favor lateral $TiSi_2$ formation. Conventional furnace annealing in an inert gas atmosphere (e.g., argon for approximately 30 minutes) may foster rapid lateral $TiSi_2$ formation. Processing in the sub-0.25 $\mu m$ domain also appears to raise the frequency of lateral silicide formation. In sub-0.25 $\mu m$ processing, the minimum gate width may approach or even reach the dimensions of the grain boundaries between the individual grains of the polycrystalline silicon gate electrode. As the minimum device size approaches the dimensions of the grain boundaries in the polysilicon, the rate of silicon diffusion from the polysilicon into the titanium increases. The increased diffusivity is believed to stem from the elimination of pluralities of intersecting polysilicon grain boundaries that are present in larger scale processes. These grain boundaries act as natural barriers to silicon diffusion.

Cobalt silicide processing has gained some recognition as a potential replacement for $TiSi_2$ in salicidation processing. Cobalt silicide provides acceptable values of sheet resistance and presents much lower risk of bridging. However, conventional $CoSi_2$ processing is not without disadvantages. Most conventional methods are similar to conventional $TiSi_2$ processing in that a layer of cobalt is deposited on silicon and/or polysilicon and annealed to trigger conversion to cobalt silicide. However, in contrast to titanium silicide processing, cobalt silicide fabrication is much more sensitive to the presence of oxide films present on monocrystalline silicon and polysilicon surfaces. Such insulating films can interfere with the cobalt-silicon reaction and lead to variations in cobalt silicide film thickness or a complete absence of cobalt silicide in certain areas. The sensitivity of the cobalt-silicon reaction to the presence of underlying insulating films, particularly oxide films, is due to the inability of cobalt to reduce oxide during the silicide-forming anneals. Titanium can readily reduce such films.

Insulating films on exposed silicon and polysilicon surfaces can form from a variety of mechanisms. For example, native oxides with thicknesses of 25 to 50 Å quickly form on silicon by simply exposing a wafer to air. Silicon surfaces may also collect carbon from derelict carbon dioxide present in processing chambers or from ambient carbon dioxide outside of such chambers. In one conventional process, the native oxide problem is addressed by chemically cleansing exposed silicon and polysilicon surfaces. A wafer is initially subjected to ammonium hydroxide-peroxide-water and sulphuric acid-peroxide-water cleansing steps. A wet HF dip is then performed to remove as much native oxide as possible. The difficulty with this approach is the potential for the HF dip to leave oxide in various places on the wafer.

Another conventional cleaning process for the removal of native oxides involves the use of sputter etching. For example, a process utilized by Digital Equipment Corporation in 1996 employed an argon ion sputter etch with an induced bias applied to the wafer of about 275 volts. The efficacy of some conventional sputter etch cleaning processes has been debated. At least one author has argued that some conventional sputter etching processes used as means of removing native oxides may cause contamination of the sputtered wafer surfaces due to the redeposition of back-sputtered material.

The present invention is directed to overcoming or reducing the effects of one or more of the foregoing disadvantages.

SUMMARY OF THE INVENTION

In accordance with one aspect of the present invention, a method of fabricating a circuit structure on a silicon surface is provided that includes exposing the silicon surface to a plasma ambient containing hydrogen and an inert gas, and depositing a metallic material capable of forming silicide on the silicon surface. The metallic material is heated to form a metal silicide on the silicon surface.

In accordance with another aspect of the present invention, a method of fabricating a silicide structure on a silicon surface of a substrate is provided that includes exposing the silicon surface to a plasma ambient containing hydrogen and an inert gas, and depositing a metallic material capable of forming silicide on the silicon surface. The metallic material is heated to form a metal silicide on the silicon surface.

In accordance with another aspect of the present invention, a method of fabricating a cobalt silicide structure on a silicon surface of a substrate is provided that includes exposing the silicon surface to a plasma ambient containing hydrogen and an inert gas wherein the substrate is not biased. Cobalt is deposited on the silicon surface. The substrate is heated to form cobalt monosilicide and heated again to convert the cobalt monosilicide to cobalt disilicide.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
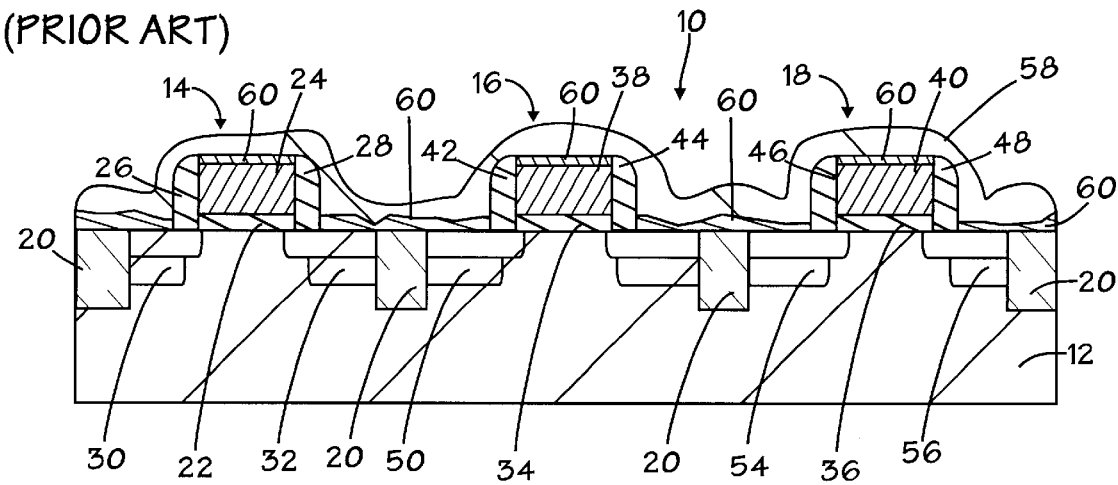
FIG. 1 is a cross-sectional view of three narrowly spaced conventional field effect transistors and depicts conventional deposition of a silicide-forming metal layer thereon.
Figure 2:
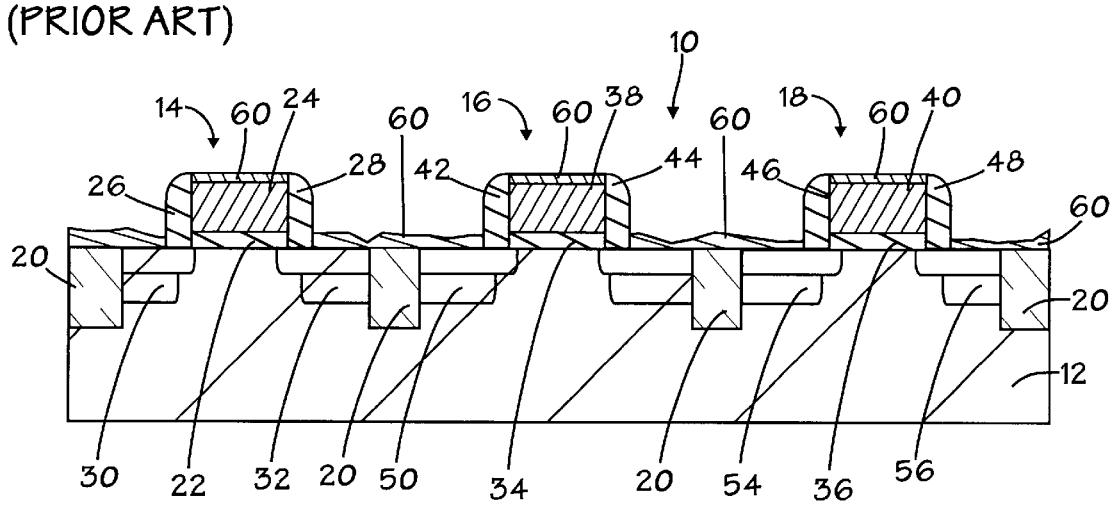
FIG. 2 is a cross-sectional view like FIG. 1 depicting a conventional plasma cleaning step performed prior to the silicide-forming metal deposition.

In the drawings described below, reference numerals are generally repeated where identical elements appear in more than one figure. FIGS. 1 and 2 illustrate two stages in a conventional cobalt silicide processing of an integrated circuit 10 on a semiconductor substrate 12. Only a small portion of the overall substrate 12 is illustrated in section. The integrated circuit 10 includes a plurality of circuit devices, in this case side-by-side transistors 14, 16 and 18 that are initially electrically isolated by trench isolation structures 20. The transistor 14 is depicted as a field effect transistor and consists of a gate oxide layer 22 positioned on the substrate 12 and a polysilicon gate electrode 24 positioned on the gate oxide layer 22. The gate oxide layer 22 and the gate electrode 24 are bracketed by a pair of oxide spacers 26 and 28. The transistor 14 is provided with a pair of dual graded source/drain regions 30 and 32 which are positioned in the substrate 12. The phrase "source/drain region(s)" is used herein to describe a region that may serve as either a source or a drain. The skilled artisan will appreciate that a source/drain region may function as a source or a drain depending upon how it is interconnected with subsequent metallization. The transistors 16 and 18 similarly consist of substantially identical and respective gate oxide layers 34 and 36, gate electrodes 38 and 40, pairs of oxide spacers 42 and 44 and 46 and 48 and pairs of dual graded source/drain regions 50 and 52 and 54 and 56.

To provide for enhanced ohmic contact between the source/drain regions 30, 32, 50, 52, 54 and 56, the gate electrodes 24, 38 and 40 and subsequently formed local and global interconnects (not shown), a cobalt silicidation process is performed. The silicidation process involves the blanket deposition of a cobalt film 58 on the substrate 12. The cobalt film is then subjected to a two stage anneal. The first stage initiates a silicide forming reaction with the exposed silicon surfaces of the substrate 12 and the polysilicon surfaces of the gate electrodes 24, 38 and 40. The second stage is performed to form a low resistivity phase of silicide.

FIGS. 1 and 2 illustrate a problem that can occur in the conventional processing of cobalt silicide films, namely the incomplete removal of an oxide insulating film 60 on the exposed surfaces of the substrate 12 and the polysilicon surfaces of the gate electrodes 24, 38 and 40 prior to cobalt deposition. FIG. 1 depicts the processing immediately after the deposition of the cobalt film 58 but prior to the silicide forming anneal steps and FIG. 2 illustrates a cleaning process performed prior to cobalt deposition. Prior to the blanket cobalt deposition, the unwanted native oxide film 60 has formed on exposed surfaces of the substrate 12 and the polysilicon surfaces of the gate electrodes 24, 38 and 40 and may be about 5 to 50 Å thick. Prior to the blanket cobalt deposition process, the substrate 12 undergoes an HF etch process to ensure that the upper surfaces of the substrate 12 consist of relatively pristine and bare silicon and/or polysilicon. Due to its inability to reduce oxide films, silicidation with cobalt requires a cobalt-to-silicon interface that is substantially free from residual oxide. Accordingly, the goal of the cleansing processes is to remove as much residual oxide remaining on the upper surfaces of the substrate 12 and the polysilicon surfaces of the gate electrodes 24, 38 and 40 in anticipation of the cobalt deposition. However, as noted above, the HF etch may leave residual native oxide, such as the film 60 depicted. Furthermore, if the substrate 12 is maintained outside of vacuum for any significant period of time after the HF etch, native oxide will readily form again.

Figure 3:
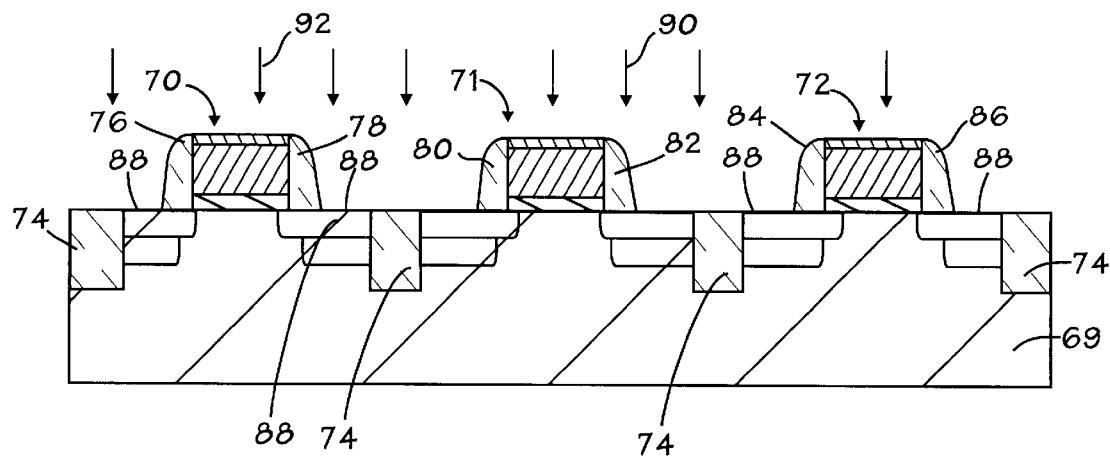
FIG. 3 is a cross-sectional view of three exemplary transistors fabricated on a substrate and depicts a plasma cleaning process in accordance with the present invention.
Figure 4:
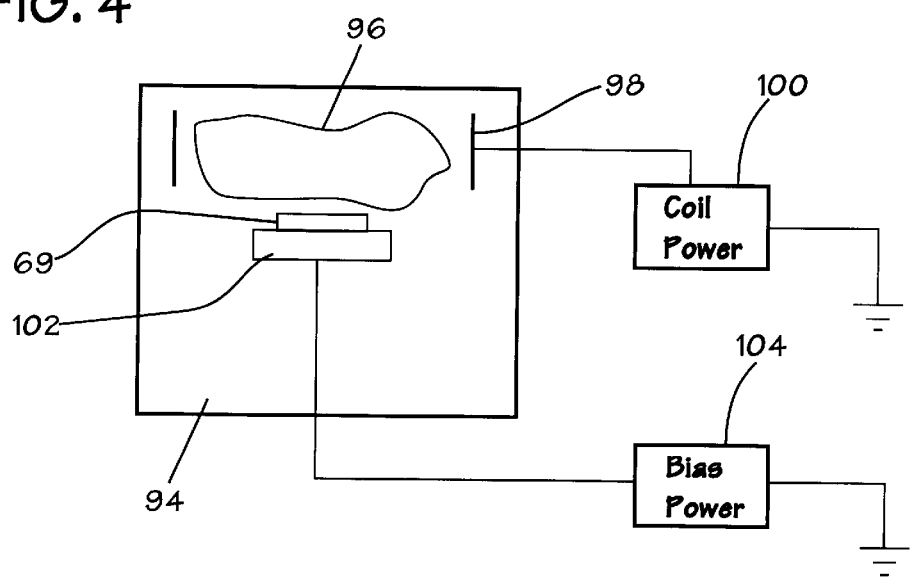
FIG. 4 is a schematic view of a sputter chamber system that may be used in accordance with the present invention.

An exemplary process flow in accordance with the present invention for providing cobalt silicidation with greatly reduced risk of unwanted native oxide may be understood by referring now to FIGS. 3, 4 and 5 and 6 and initially to FIG. 3. FIG. 3 depicts a cross-sectional view of a small portion of a semiconductor substrate 69 upon which three transistors 70, 71 and 72 are fabricated. For the purpose of this illustration, the transistors 70, 71 and 72 may be substantially identical to the transistors 14, 16 and 18 depicted in FIGS. 1 and 2 and the constituent parts thereof may be formed using well-known fabrication techniques. As with the aforementioned transistors 14, 16 and 18, the transistors 70, 71 and 72 arm provided with lateral electrical isolation by isolation structures 74 and with respective sets of insulating spacers 76, 78, 80, 82, 84 and 86. The spacers 76, 78, 80, 82, 94 and 86 have a trapezoidal cross-section although their particular geometry is largely a matter of design discretion.

Initially, the exposed surfaces 88 of the substrate 69 may be exposed to a tripartite liquid cleaning process to remove particulate contamination and various other types of residues. In an exemplary embodiment, an ammonium hydroxide, peroxide and water spray rinse is performed at about 30 to 80° C. followed by a sulfuric acid peroxide and water spray rinse at room temperature. In each case, the spray rinse is followed by a deionized water rinse. An HF etch with a 50:1 or 100:1 water to HF ratio is next performed to remove as much native oxide as possible from the exposed surfaces 88 of the substrate 69.

Following the HF dip, the substrate 69 is subjected to an in-situ hydrogen plasma clean process to remove a preselected portion of the exposed surfaces 88 of the substrate 69 to ensure complete or nearly complete removal of any native oxides. In an exemplary embodiment, a flow of hydrogen gas 90 is mixed with a relatively larger quantity of an inert gas 92, such as argon, xenon, krypton, etc., and a plasma is excited in a chamber, such as the chamber 94 depicted in FIG. 4. The hydrogen plasma 96 is excited by an inductively coupled plasma coil 98 that is powered by a coil power supply 100. The substrate 69 is seated on a plate 102 that is coupled to an rf bias power supply 104.

The hydrogen plasma works by etching away any native oxides present on the upper surfaces 88 of the substrate 69 by chemical reactivity and not by kinetic bombardment. The bias power supply 104 is not energized and bias is not applied to the plate 102 holding the substrate 69. Accordingly, physical sputtering of the spacers 76, 78, 80, 82, 84 and 86 of the transistors 70, 71 and 72 does not occur from the introduction of the hydrogen and argon. In an exemplary embodiment, approximately 60 sccm $H_2$ and 600 sccm argon are introduced into the sputter chamber 94. The total pressure of the $H_2$ and argon is about 100 to 200 mtorr.

In various types of plasma sputtering tools, it is sometimes difficult to excite a plasma in a pure hydrogen ambient. Accordingly, the introduction of argon 92 with hydrogen 90 facilitates the initiation of the plasma. It is anticipated that the hydrogen 90 will react with not only any native oxides present but also carbon that may have been absorbed into the substrate 69 either in elemental form or in combination with oxygen or other constituents.

An experiment was performed in an Applied Materials Endura 5500 tool fitted with a CVD plasma chamber. The plasma was excited with a plasma power of about 200 to 300 watts utilizing the foregoing hydrogen-inert gas mixture. The experiment yielded an etch rate for oxide of about 32 Å/minute. Thus, under these conditions, an etch may be performed for about 47 to 94 seconds where it is desired to remove 25 to 50 Å of material from the substrate 69. Note that this experimental plasma power should be modified if the etch is performed in the chamber 61 described above. For example, the plasma coil 63 should be energized to about 200 to 300 watts at about 400 kHz. The skilled artisan will also appreciate that the aforementioned etch times may vary depending on the tool used.

A queue-time dependence for the hydrogen plasma process of the present invention has not been observed. Thus, cobalt silicidation may be performed with reduced risk of poor sheet resistance in circumstances where fabrication requirements introduce time delays between plasma clean and cobalt deposition.

It is anticipated that the hydrogen plasma mixture may be used with a biased substrate 69. For example, the bias power supply 1046 may be set at about 225 watts and an rf frequency of 13.56 MHz, and the coil power supply may be set at about 225 watts. The accelerated argon ions 92 will physically sputter oxide while the hydrogen 90 will chemically remove existing and any backsputtered oxide. It is also anticipated that the hydrogen plasma clean in accordance with the present invention may be used with or in lieu of the aforementioned HF etch.

Figure 5:
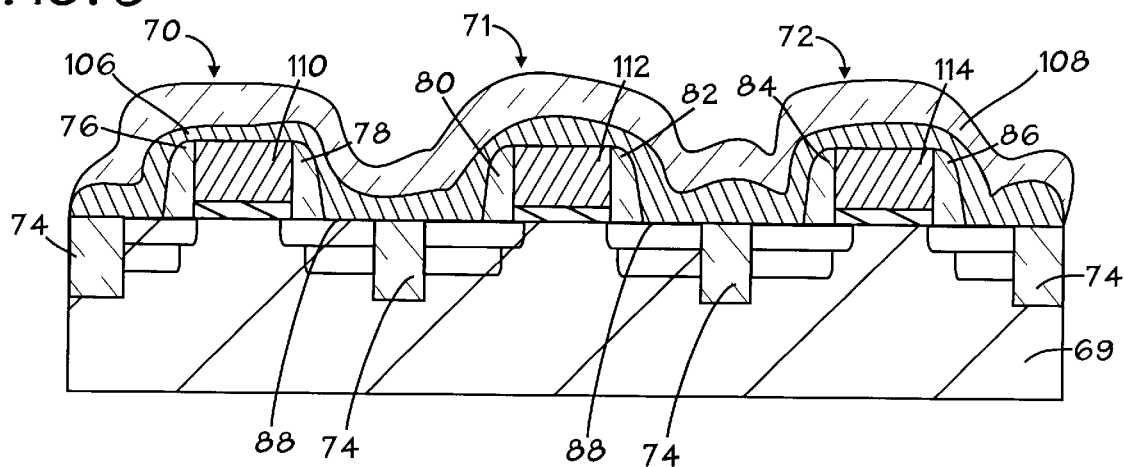
FIG. 5 is a cross-sectional view like FIG. 3 depicting deposition of a silicide-forming metal layer over the transistors in accordance with the present invention.

Referring now to FIG. 5, a film 106 of a metallic material capable of forming silicide is formed on the substrate 69 by blanket PVD, preferably without breaking vacuum following the plasma clean. The film 106 may be composed of a cobalt-containing material, such as relatively pure cobalt or cobalt combined with a small amount of another constituent or constituents, such as platinum, gold or the like, or other metallic materials suitable for silicide formation, such as, for example, platinum, palladium, nickel, titanium, tungsten, tantalum, molybdenum or the like. As used herein, the phrase "composed of" is not intended to exclude the incorporation of other constituents in a given layer. Other materials cable of forming silicide may be used, such as nickel. The thickness of the cobalt film 106 is largely a matter of design discretion. In an exemplary embodiment, the film 106 is composed of relatively pure cobalt and may be deposited by PVD to a thickness of about 30 to 500 Å.

The cobalt film 106 may next be capped with a titanium layer 108 deposited by blanket PVD. The titanium cap layer 108 is provided to prevent the oxidation of the cobalt film 108 during subsequent silicide anneals. The thickness of the titanium cap layer 108 is largely a matter of design discretion. In an exemplary embodiment, the titanium cap 108 layer may be about 30 to 500 Å thick.

Figure 6:
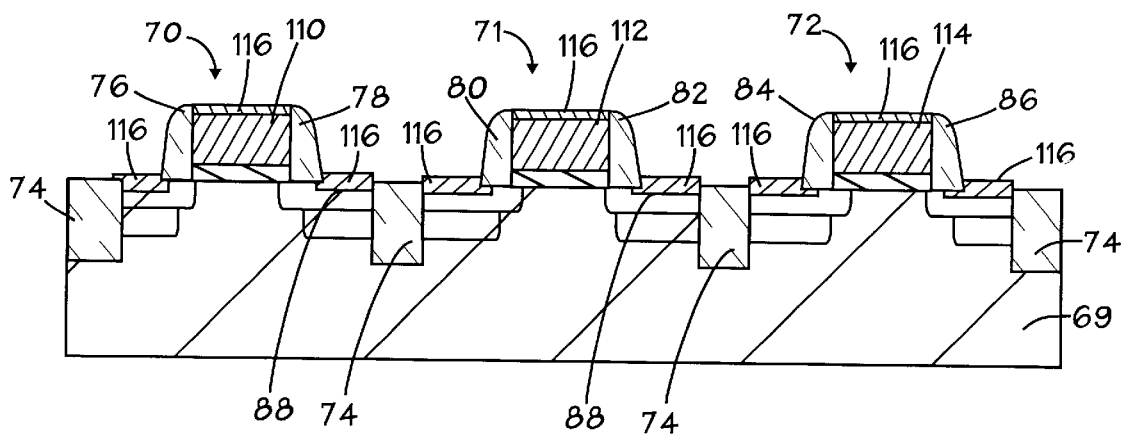
FIG. 6 is a cross-sectional view like FIG. 5 depicting definition of silicide films from the silicide-forming metal layer depicted in FIG. 5 in accordance with the present invention.

Referring now also to FIG. 6, the substrate 69 is next subjected to the first of a two step silicide forming anneal process. The first anneal may be performed at about 400 to 600° C. and advantageously at about 470° C. for about 30 to 120 seconds in an RTA with an inert ambient of argon or nitrogen. This anneal initiates a silicide forming reaction between the cobalt film 106 and the underlying silicon substrate 69 and polysilicon gate electrodes 110, 112 and 114. As the silicide reaction is consumptive of silicon and polysilicon, the layer 106 partially invades the substrate 69 and the polysilicon gates 110, 112 and 114. Note that this reaction will not occur at the gates 110, 112 and 114 where they are not silicon based.

The titanium cap layer 108 and any unreacted cobalt left over from the cobalt film 106 are next stripped by etching with ammonium hydroxide-peroxide followed by etching with sulfuric acid-peroxide. What remains is a film 116 of CoSi overlying the exposed portions 88 of the substrate 69 and the polysilicon gate electrodes 96, 98 and 100. A second anneal is next performed at about 700 to 900° C. for about 15 to 240 seconds in an RTA to convert the film 116 from CoSi to $CoSi_2$.

The skilled artisan will appreciate that the process of the present invention enables reliable manufacture of cobalt silicide films with lower sheet resistance, particularly between narrowly spaced spacer structures. Native oxides may be reliably removed from silicon surfaces prior to silicide-forming metal deposition.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit structure on a silicon surface adjacent to an insulating structure, comprising:

chemically removing any oxide on the silicon surface by exposing the silicon surface to a plasma ambient containing hydrogen and an inert gas without applying a bias to the silicon surface to avoid sputtering parts of the insulating structure onto the silicon surface;

depositing a metallic material capable of forming silicide on the silicon surface; and heating the metallic material to from a metal silicide on the silicon surfaces.

2. The method of claim 1, wherein the inert gas comprises argon.

3. The method of claim 1, wherein the metallic material comprises cobalt.

4. The method of claim 3, wherein the heating of the metallic material comprises a first anneal to convert the cobalt to cobalt monosilicide and a second anneal to convert the cobalt monosilicide to cobalt disilicide.

5. The method of claim 1, wherein the exposure of the silicon surface to a plasma ambient and the deposition of the cobalt are performed without breaking vacuum.

6. The method of claim 1, comprising cleaning the silicon surface with at least one peroxide-based solution prior to exposing the silicon surface to the plasma ambient.

7. A method of fabricating a silicide structure on a silicon surface of a substrate, the silicon surface being adjacent to an insulating structure, comprising:

chemically removing any oxide on the silicon surface by exposing the silicon surface to a plasma ambient containing hydrogen and an inert gas without applying a bias to the substrate to avoid sputtering parts of the insulating structure onto the silicon surface;

depositing a metallic material capable of forming silicide on the silicon surface; and heating the metallic material to form a metal silicide on the silicon surface.

8. The method of claim 7, wherein the inert gas comprises argon.

9. The method of claim 7, wherein the metallic material comprises cobalt.

10. The method of claim 9, wherein the heating of the metallic material comprises a first anneal to convert the cobalt to cobalt monosilicide and a second anneal to convert the cobalt monosilicide to cobalt disilicide.

11. The method of claim 7, wherein the exposure of the silicon surface to a plasma ambient and the deposition of the cobalt are performed without breaking vacuum.

12. The method of claim 7, comprising cleaning the silicon surface with at least one peroxide-based solution prior to exposing the silicon surface to the plasma ambient.

13. A method of fabricating a cobalt silicide structure on a silicon surface of a substrate, the silicon surface being adjacent to an insulating structure, comprising:

chemically removing any oxide on the silicon surface by exposing the silicon surface to a plasma ambient containing hydrogen and an inert gas wherein the substrate is not biased to avoid sputtering parts of the insulating structure onto the silicon surface;

depositing cobalt on the silicon surface;

heating the substrate to from cobalt monosilicide; and heating the substrate to convert the cobalt monosilicide to cobalt disilicide.

14. The method of claim 13, wherein the inert gas comprises argon.

15. The method of claim 13, wherein the exposure of the silicon surface to a plasma ambient and the deposition of the cobalt are performed without breaking vacuum.

16. The method of claim 13, comprising cleaning the silicon surface with at least one peroxide-based solution prior to exposing the silicon surface to the plasma ambient.

* * * * *